United States Patent [19]

Kuwahara

[11] Patent Number: 5,331,184
[45] Date of Patent: Jul. 19, 1994

[54] INSULATED GATE BIPOLAR TRANSISTOR HAVING HIGH BREAKDOWN VOLTAGE

[75] Inventor: Masashi Kuwahara, Yokohama, Japan

[73] Assignee: Kabushiki Kaisha Toshiba, Kawasaki, Japan

[21] Appl. No.: 928,066

[22] Filed: Aug. 11, 1992

[30] Foreign Application Priority Data

Aug. 12, 1991 [JP] Japan .................. 3-225382

[51] Int. Cl.$^5$ .................. H01L 29/74; H01L 31/111; H01L 29/76; H01L 23/58
[52] U.S. Cl. .................. 257/139; 257/138; 257/378; 257/487
[58] Field of Search .................. 357/38, 23.4, 39, 35; 257/139, 138, 378, 487

[56] References Cited

U.S. PATENT DOCUMENTS

| | | | |
|---|---|---|---|
| 4,782,379 | 11/1988 | Baliga | 257/139 |
| 5,023,696 | 6/1991 | Ogino | 357/23.4 |
| 5,031,009 | 7/1991 | Fujihira | 257/139 |

FOREIGN PATENT DOCUMENTS

| | | |
|---|---|---|
| 0154082 | 9/1985 | European Pat. Off. . |
| 0430133 | 6/1991 | European Pat. Off. . |
| 0430237 | 6/1991 | European Pat. Off. . |
| 4112905 | 10/1991 | Fed. Rep. of Germany . |
| 57-120369 | 7/1982 | Japan . |
| 27569 | 1/1990 | Japan . |

OTHER PUBLICATIONS

IEEE, PESC 1989, Record vol. 1, pp. 21-24, Sep. 21, 1989, G. Miller, et al. "A New Concept for a Non Punch Through IGBT with MOSFET Like Switching Characteristics".

Primary Examiner—Rolf Hille
Assistant Examiner—Wael Fahmy
Attorney, Agent, or Firm—Oblon, Spivak, McClelland, Maier & Neustadt

[57] ABSTRACT

An insulated gate bipolar transistor having a low on-voltage and a low turn-off time is provided. P-type anode layer having a low impurity concentration, preferably $1 \times 10^{16}$ to $1 \times 10^{17}/cm^3$, is provided on an N-type drain layer that includes a pair of P-type base regions each having an N+-type source region. A plurality of P+-type anode regions are formed in the P-type anode layer.

10 Claims, 3 Drawing Sheets

INSULATED GATE BIPOLAR TRANSISTOR HAVING HIGH BREAKDOWN VOLTAGE

BACKGROUND OF THE INVENTION

Field of the Invention

The present invention relates to a power semiconductor device and, more particularly, to an IGBT (Insulated Gate Bipolar Transistor) having a high breakdown voltage of 1,200 V or more.

Description of the Related Art

A conventional IGBT has a sectional structure as shown in FIG. 6, and its basic operation is described in Published Unexamined Japanese Patent Application No. 57-120369 in detail.

An N-channel IGBT formed in a silicon substrate will be described with reference to FIG. 6.

A semiconductor substrate 1 consists of a P+-type anode layer 11 having a thickness of about 150 µm and an impurity concentration of about $10^{20}/cm^3$, and an N--type drain layer 12 formed on a first major surface of the anode layer 11. The N--type drain layer 12 includes a pair of P-type base regions 13 in which an annular N+-type source region 14 is provided. A polysilicon gate electrode 16 is provided on the substrate surface through a thin oxide film 15. A source electrode 17 is provided to short-circuit the source and base regions 14 and 13. A gate electrode 18 is provided on the polysilicon gate electrode 16, and an anode electrode 19 is formed on the lower surface of the P+-type anode layer 11.

In the IGBT having this structure, when the gate electrode 16 is kept at a negative potential while grounding the source electrode 17 and applying a positive voltage to the anode electrode 19, the IGBT assumes an off-state. When a positive potential is applied to the gate electrode 16, an inversion channel layer is produced in the surface layer of the P-type base region 13, as in other conventional IGBTs. Therefore, electrons flow from the source region 14 into the surface layer of the drain layer 12 through the inversion channel layer to provide an electron accumulation layer. The electrons are further moved toward the anode electrode 19 through the drain layer 12 by the voltage applied between the source and the anode, thereby providing a forward-biased condition between the P+-type anode layer 11 and the N--type drain layer 12. Holes are then injected from the P+-type anode layer 11 to the N--type drain layer 12 to modulate the conductivity of the N--type drain layer 12 and to turn on the IGBT. In this state, when the gate electrode 18 is returned to zero or negative potential, the channel is closed and the off-state is again obtained.

In the IGBT, however, a part of the minority carriers (holes) injected from the anode layer 11 to the drain layer 12 are undesirably accumulated in the drain layer 12 as excessive minority carriers. Accordingly, in order to turn off the IGBT, even if the gate voltage is set to zero to close the channel, thus stopping the flow of the electrons, the IGBT is not turned off until the accumulated minority carrier are removed from the drain layer 12. Furthermore, in this IGBT, when the electrons present in the drain layer 12 pass through the anode layer 11 during the turn-off operation, a new hole injection is induced from the anode layer 12 to increase the turn-off time. As a result, the current flowing through the IGBT is increased by about 10 times that of a conventional vertical MOSFET. However, the turn-off time is increased to about 10 times or more. In the case where such an IGBT is applied to switching devices, e.g., an inverter, its application is quite limited because a long turn-off time prevents an increase in the switching frequency.

For improving the turn-off time of the IGBT, it has been known to reduce the carrier life time. The carrier life time can be reduced by diffusing a heavy metal, e.g., Au, Pt, etc., into a desired semiconductor region, or by applying a radiation, e.g., a neutron beam, a gamma-ray, an electron beam, etc., thereto. In this case, however, although the turn-off time is improved, the degree of the conductivity modulation is degraded, so that the low on-resistance characteristic that is the greatest advantage of the IGBT is deteriorated. It may be also considered to decrease the impurity concentration of the P+-type anode layer 11 in order to suppress the hole injection from the anode. When, however, the impurity concentration of the P+-type anode layer 11 is decreased, the contact resistance with the metal electrode is increased to increase the on-resistance of the device. When the high breakdown voltage of 1,200 V or more is required for the IGBT, it is necessary that the N'-type drain layer has a very low impurity concentration of about $5 \times 10^{13}/cm^3$ and a thickness of 100 µm or more. However, it is difficult to stably provide such a drain layer according to present epitaxial growth techniques. Published Unexamined Japanese Patent Application No. 2-7569 discloses that a double diffusion type DMOS structure is provided in one surface of a lightly doped N--type semiconductor substrate and that a P+-type anode layer is formed in the other surface by ion implantation techniques. However, since the P+-type anode layer has a very shallow junction depth of about 1 µm, the structure can be easily influenced by the surface state, and stable characteristics cannot be obtained.

SUMMARY OF THE INVENTION

It is, therefore, an object of the present invention to provide an IGBT having low on-resistance and high-speed switching characteristics.

It is another object of the present invention to provide an IGBT capable of freely setting an impurity concentration and a thickness of a drain layer.

It is still another object of the present invention to provide an IGBT having a high breakdown voltage.

According to an aspect of the present invention, there is provided an IGBT, which comprises a semiconductor substrate including a drain layer of one conductivity type and a first anode layer of an opposite conductivity type having a low impurity concentration, a pair of base regions of an opposite conductivity type provided in the drain layer, the pair of base regions being spaced apart from each other, a source region of one conductivity type provided in each of the base regions, a gate electrode provided over a surface of the drain layer through a gate insulating film so as to overlap the source region, and a plurality of second anode regions of an opposite conductivity type having a high impurity concentration and provided in the first anode layer.

BRIEF DESCRIPTION OF THE DRAWINGS

The novel and distinctive features of the invention are set forth in the claims appended to the present application. The invention itself, however, together with further objects and advantages thereof may best be understood by reference to the following description and accompanying drawings in which:

DETAILED DESCRIPTION OF THE PREFERRED EMBODIMENTS

The preferred embodiments of the present invention will be described with reference to the accompanying drawings.

Figure 1:
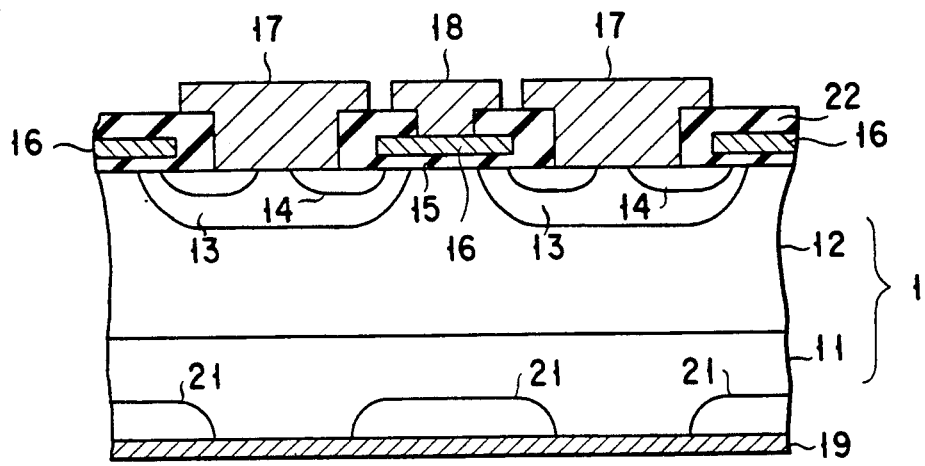
FIG. 1 is a sectional view showing an IGBT according to a first embodiment of the present invention.

FIG. 1 shows an N-channel IGBT according to the first embodiment of the present invention. A semiconductor substrate 1 includes an $N^-$-type drain layer 12 and a P-type anode layer 11 made by epitaxial growth. A thickness of the semiconductor substrate 1 is 250 to 300 μm. The P-type anode layer 11 has a thickness of 10 to 50 μm and an impurity concentration of $1 \times 10^{16}$ to $1 \times 10^{17}/cm^3$. The $N^-$-type drain layer 12 has an impurity concentration of $1 \times 10^{13}$ to $1 \times 10^{14}/cm^3$. A pair of P-type base regions 13 are formed in the $N^-$-type drain layer 12 to be spaced apart from each other by a predetermined distance. An $N^+$-type source region 14 is formed in each P-type base region 13. A polysilicon gate electrode 16 is provided on the surface of the semiconductor substrate 1 through a thin oxide film 15. The gate electrode 16 is disposed so as to overlap the pair of source regions 14 and the base region 13. A source electrode 17 is provided to short-circuit the source and base regions 14 and 13. A plurality of heavily doped $P^+$-type anode regions 21 are formed in the P-type anode layer 11. The impurity concentration of each anode region 21 is generally selected in the range of $1 \times 10^{18}$ to $1 \times 10^{20}/cm^3$, and the appropriate thickness thereof is 2 to 5 μm. A gate electrode 18 is provided on the polysilicon gate electrode 16, and an anode electrode 19 is provided so as to cover the P-type anode layer 11 and the $P^+$-type anode regions 21. The gate oxide film 15 is covered with an insulating film 22 of, e.g., $SiO_2$.

According to the present invention, since the impurity concentration of the P-type anode layer 11 is made low and the heavily doped anode regions 21 are provided in the P-type anode layer 11, a good ohmic contact can be provided. In addition, even if the carrier life time of the $N^-$-type drain layer 12 is kept long, the high-speed switching characteristic can be obtained because the injection amount of holes is controlled. Further, since the carrier life time of the $N^-$-type drain layer 12 is long and the recombination centers are reduced, holes injected from the P-type anode layer 11 contribute effectively to the conductivity modulation to decrease the on-voltage, thus providing an IGBT having low on-voltage and high-speed switching characteristics.

The second embodiment of the present invention will be described with reference to FIG. 2.

Figure 2:
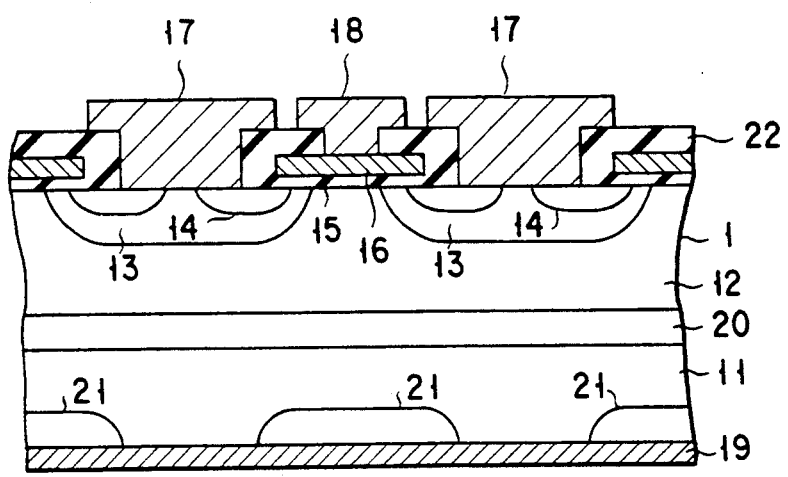
FIG. 2 is a sectional view showing an IGBT according to a second embodiment of the present invention.

FIG. 2 shows an IGBT having an $N^+$-type buffer layer 20 between drain and anode layers 12 and 11. The $N^+$-type buffer layer 20 and the P-type anode layer 11 are sequentially grown on the $N^-$-type drain layer 12 by, e.g., epitaxial growth. Because of the presence of the buffer layer 20, the turn-off time of the IGBT is improved and the high-speed characteristic can be obtained. Even if the impurity concentration of the P-type anode layer 11 is increased more or less, the characteristics of the IGBT are not particularly affected.

The third embodiment of the present invention will be described with reference to FIG. 3.

Figure 3:
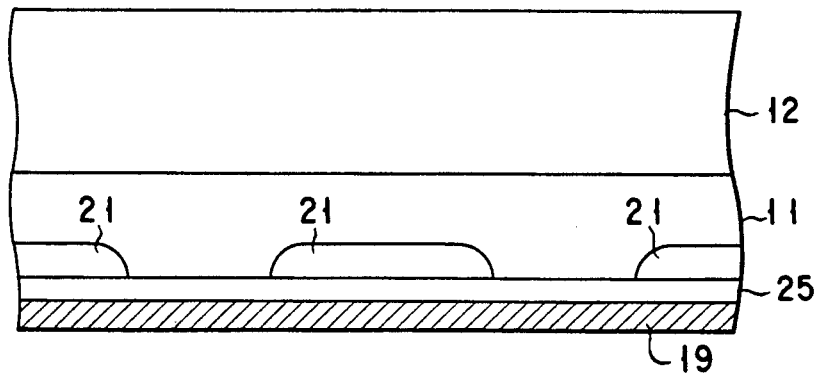
FIG. 3 is a schematic sectional view showing an IGBT according to a third embodiment of the present invention.

FIG. 3 shows a sectional view of the main part of an IGBT. Heavily doped $P^+$-type anode regions 21 are formed in the P-type anode layer 11, in the same manner as the first and second embodiments. A damaged crystal lattice layer 25 having a thickness of about 1 μm is formed on the substrate surface. The damaged crystal lattice layer 25 can be formed by honing the substrate surface with grindstone particles to obtain a rough surface. Because of the presence of the damaged crystal lattice layer 25, an anode electrode 19 is in contact with the anode layer 11 and the heavily doped anode regions 21 to decrease the contact resistance, thereby stabilizing the IGBT characteristics.

As a material of the anode electrode 19, Ti, Al, Au, Pt, W, Mo, or the like can be used regardless of the presence of the damaged crystal lattice layer 25. When Al is used as the electrode material, the electrode is stabilized by a heat-treatment.

The effect of the impurity concentration of the lightly doped anode layer of the present invention will be described with reference to FIG. 4.

Figure 4:
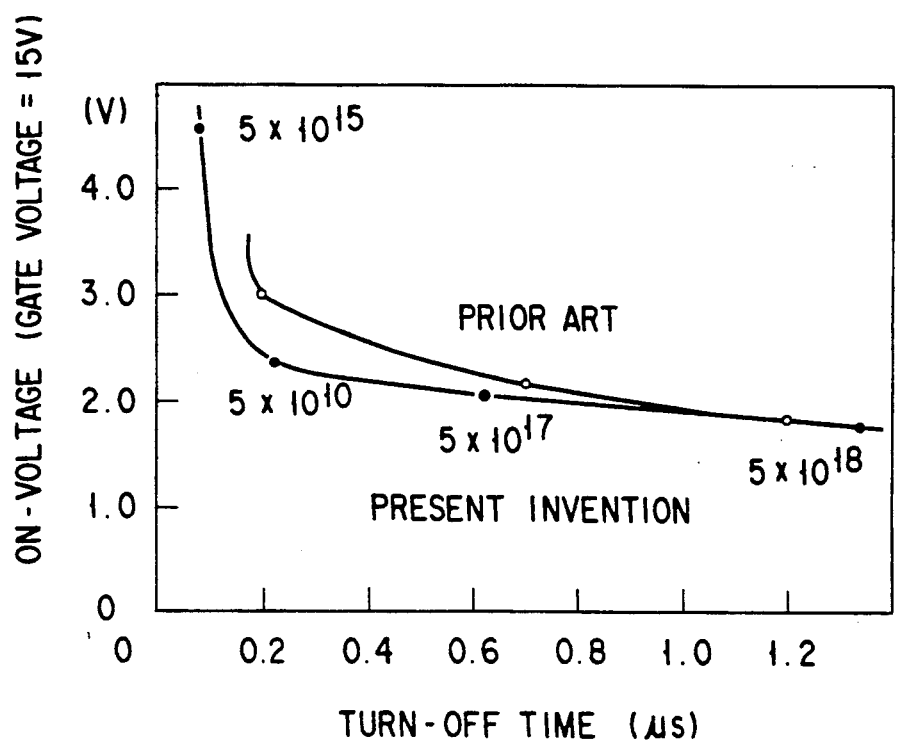
FIG. 4 is a graph showing a relationship between the on-voltage and the turn-off time of the IGBT according to the present invention.

FIG. 4 is a graph showing the relationship between the on-voltage and the turn-off time when the impurity concentration of the lightly doped anode layer 11 is changed. The impurity concentration of the lightly doped anode layer 11 is changed in the range of $5 \times 10^{15}$ to $5 \times 10^{18}/cm^3$. When the impurity concentration of the anode layer 11 is decreased, the on-voltage is increased although the turn-off time is reduced. On the contrary, when the impurity concentration is increased, the turn-off time is increased although the on-voltage is decreased. An available frequency of an ordinary inverter is in the range of several kHz to several tens kHz. Therefore, it is necessary that the turn-off time is 1 μs or less in order to suppress heat generation of the IGBT. Similarly, the on-voltage is preferably 4 V or less. Accordingly, the appropriate impurity concentration of the lightly doped anode layer 11 is in the range of $1 \times 10^{16}$ to $1 \times 10^{17}/cm^3$. When the impurity concentration is changed within the range, the on-voltage and the turn-off time can be controlled.

The effect of the impurity concentration of the heavily doped anode layer of the present invention will be described with reference to FIG. 5.

Figure 5:
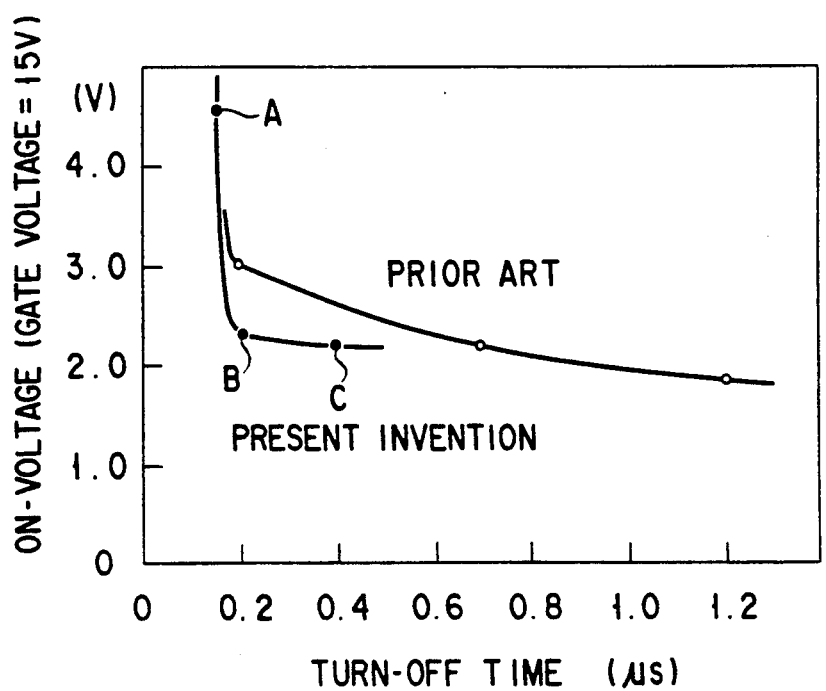
FIG. 5 is a graph showing a relationship between the on-voltage and the turn-off time of another IGBT according to the present invention.
Figure 6:
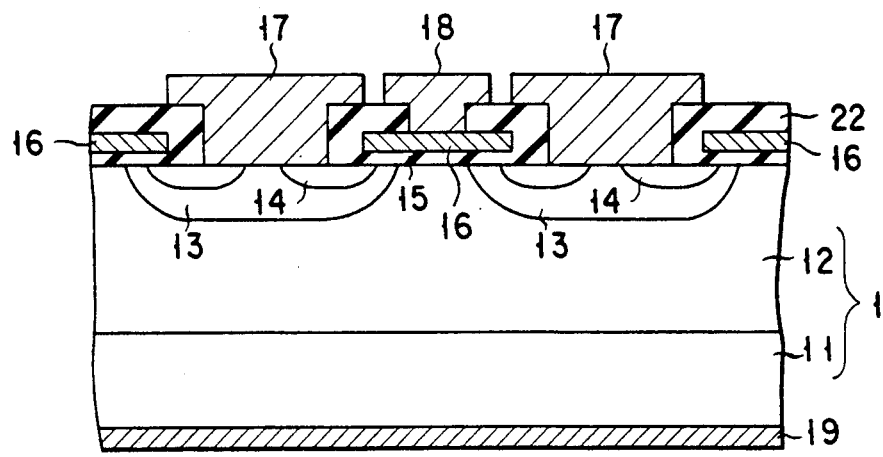
FIG. 6 is a sectional view showing a conventional IGBT.

FIG. 5 is a graph showing the relationship between the on-voltage and the turn-off time when the area ratio of the heavily doped anode regions 21 to the lightly doped anode layer 11 is changed. In FIG. 5, a point A represents a characteristic obtained when no heavily doped anode regions 21 are provided; B a characteristic obtained when the area ratio of the regions 21 to the layer 11 is 1/1; and C, a characteristic obtained when no lightly doped anode region layer 11 is provided, respectively. At this time, the impurity concentration of the lightly doped anode layer 11 is defined by $5\times10^{16}/cm^3$. when the area of the heavily doped anode regions 21 is small, the on-voltage becomes high, and the variation in characteristics becomes large. On the contrary, when the heavily doped anode regions 21 are formed on the entire surface of the P-type anode layer 11, the turn-off time is increased to about 0.4 μs which cannot respond to a high frequency.

The above embodiments have described the N-channel IGBT. However, the present invention can be applied to a P-channel IGBT. In epitaxial growth, the wafer cost is increased in proportion to the thickness of the grown layer. However, according to the present invention, since it is not necessary to increase the thickness of the epitaxially grown layer considerably, the IGBT having the high breakdown voltage of 1,200 V or more required for the thickness of about 100 μm can be realized in less than half the cost of the conventional IGBT.

According to the present invention, since the impurity concentration of the anode layer is made low and the heavily doped regions are provided in the anode layer, a good ohmic contact can be obtained. In addition, even if the carrier life time of the drain layer is kept long, the high-speed switching characteristic can be obtained because the injection amount of holes is controlled. Further, since the carrier life time of the drain layer is long and the recombination centers are reduced, the carrier injected from the anode layer contribute effectively to the conductivity modulation to decrease the on-voltage, thus providing an IGBT having low on-voltage and high-speed switching characteristics. More further, although an IGBT having a high breakdown voltage requires a thick drain layer having a low impurity concentration which is not manufactured by the present epitaxial growth techniques, the impurity concentration and thickness of the wafer can be freely set since the drain layer is formed of the wafer sliced from a monocrystalline silicon ingot.

It is further understood by those skilled in the art that the foregoing description is only of the preferred embodiments and that various changes and modifications may be made in the invention without departing from the spirit and scope thereof.

What is claimed is:

1. An insulated gate bipolar transistor comprising:
   a semiconductor substrate including a first region of first conductivity type and a second region of second conductivity type provided over said first region;
   a third region of said second conductivity type provided in said first region;
   a fourth region of said first conductivity type provided in said third region;
   a first main electrode ohmically connected to said third and fourth regions;
   a gate insulating film provided on said first region so as to extend to said fourth region over said third region;
   a gate electrode provided on said gate insulating film so as to be disposed over said third region;
   a plurality of fifth regions of said second conductivity type, provided in said second region, each having an impurity concentration higher than that of said second region; and
   a second main electrode ohmically connected to said second region together with said fifth regions.

2. The insulated gate bipolar transistor according to claim 1, wherein said second region has an impurity concentration of $1\times10^{16}$ to $1\times10^{17}/cm^3$.

3. The insulated gate bipolar transistor according to claim 1, wherein each of said fifth regions has an impurity concentration of $1\times10^{18}$ to $1\times10^{20}/cm^3$.

4. An insulated gate bipolar transistor comprising:
   a drain layer of first conductivity type having first and second surfaces;
   first and second base regions of second conductivity type opposite to said first conductivity type provided in said first surface of said drain layer, said first and second base regions being spaced apart from each other;
   a source region of said first conductivity type provided in each of said first and second base regions;
   a first main electrode provided on each of said first and second base regions so as to extend over said source region;
   a gate electrode provided on said first surface of said drain layer through a gate insulating film so as to extend over each of said first and second base regions;
   a first anode layer of said second conductivity type provided on said second surface of said drain layer;
   a plurality of second anode regions of said second conductivity type, provided in said first anode layer, each having an impurity concentration higher than that of said first anode layer; and
   a second main electrode provided over said first anode layer so as to be in contact with said second anode regions.

5. The insulated gate bipolar transistor according to claim 4, wherein said first anode layer has an impurity concentration of $1\times10^{16}$ to $1\times10^{17}/cm^3$.

6. The insulated gate bipolar transistor according to claim 4, wherein each of said second anode regions has an impurity concentration of $1\times10^{18}$ to $1\times10^{20}/cm^3$.

7. The insulated gate bipolar transistor according to claim 4, wherein a buffer layer of said first conductivity type having an impurity concentration higher than that of said drain region is provided between said drain layer and said first anode layer.

8. The insulated gate bipolar transistor according to claim 4, wherein a crystal defect layer is provided at surface portions of said first anode layer and said second anode regions.

9. The insulated gate bipolar transistor according to claim 4, wherein said second anode regions are formed at a surface portion of said first anode layer and a ratio of the total surface area of said second anode regions forming part of said surface portion to the total surface area of said first anode layer forming the remaining part of said surface portion is variable by changing the size or number of said second anode regions formed at said surface portion.

10. The insulated gate bipolar transistor according to claim 9, wherein said ratio is 1:1.

* * * * *